(12) United States Patent
Wakatsuki et al.

(10) Patent No.: US 8,141,567 B2
(45) Date of Patent: Mar. 27, 2012

(54) APPARATUS AND METHOD FOR PHOTORESIST REMOVAL PROCESSING

(75) Inventors: Takahiko Wakatsuki, Kanagawa-ken (JP); Naoya Hayamizu, Kanagawa-ken (JP); Hiroshi Fujita, Kanagawa-ken (JP); Akiko Saito, Kanagawa-ken (JP); Toshihide Hayashi, Kanagawa-ken (JP); Yukinobu Nishibe, Kanagawa-ken (JP); Tsutomu Makino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1020 days.

(21) Appl. No.: 11/625,081

(22) Filed: Jan. 19, 2007

(65) Prior Publication Data
US 2007/0277853 A1    Dec. 6, 2007

(30) Foreign Application Priority Data
Jan. 20, 2006    (JP) .................................. 2006-12758

(51) Int. Cl.
    *B08B 3/04*    (2006.01)
(52) U.S. Cl. .................... 134/108; 134/111; 134/104.4
(58) Field of Classification Search .................. 68/18 R, 68/18 C, 18 F; 134/110, 111, 901, 108
See application file for complete search history.

(56) References Cited

U.S. PATENT DOCUMENTS

| | | | | |
|---|---|---|---|---|
| 1,874,972 A | * | 8/1932 | Hall | 208/38 |
| 3,026,043 A | * | 3/1962 | Lacy et al. | 237/67 |
| 3,046,163 A | * | 7/1962 | Kearney et al. | 134/11 |
| 3,317,052 A | * | 5/1967 | Davis | 210/393 |
| 3,413,987 A | * | 12/1968 | Brown | 134/46 |
| 3,449,244 A | * | 6/1969 | Clay et al. | 210/634 |
| 3,871,951 A | * | 3/1975 | Drew | 162/14 |
| 4,681,510 A | * | 7/1987 | Swenson et al. | 415/169.1 |
| 4,996,781 A | * | 3/1991 | Mishina et al. | 34/74 |
| 5,120,370 A | * | 6/1992 | Mori et al. | 134/22.15 |
| 5,466,344 A | * | 11/1995 | Lindke | 202/205 |
| 5,472,667 A | * | 12/1995 | Karthaus et al. | 422/31 |
| 5,799,643 A | | 9/1998 | Miyata et al. | |
| 6,048,502 A | * | 4/2000 | Easter | 422/298 |

(Continued)

FOREIGN PATENT DOCUMENTS

DE        196 53 702        * 8/1998

(Continued)

OTHER PUBLICATIONS

Office Action issued Jun. 27, 2011, in Taiwanese Patent Application No. 096102245 (with English-language translation).

(Continued)

*Primary Examiner* — Frankie L Stinson
(74) *Attorney, Agent, or Firm* — Oblon, Spivak, McClelland, Maier & Neustadt, L.L.P.

(57) ABSTRACT

A processing apparatus includes: a tank configured to store water; vapor generating unit configured to turn the water supplied from the tank into vapor; a processing chamber in which vapor supplied from the vapor generating unit is used to remove residues from a workpiece; cooling unit; and filtering unit. The cooling unit cools waste liquid ejected from the processing chamber. The filtering unit is provided between the cooling unit and the tank, and the filtering unit filters the waste liquid cooled in the cooling unit. A processing method includes: supplying vapor into a processing chamber; removing residues from a workpiece using the vapor; cooling waste liquid containing the removed residues to precipitate the residues as solids; and filtering the waste liquid containing the precipitates.

11 Claims, 5 Drawing Sheets

U.S. PATENT DOCUMENTS

| | | | | |
|---|---|---|---|---|
| 6,119,365 | A * | 9/2000 | Wuller et al. | 34/218 |
| 6,146,469 | A * | 11/2000 | Toshima | 134/37 |
| 6,178,973 | B1 * | 1/2001 | Franca et al. | 134/1.3 |
| 6,460,552 | B1 * | 10/2002 | Lorimer | 134/148 |
| 6,746,600 | B2 * | 6/2004 | Nguyen | 210/167.06 |
| 6,817,368 | B2 * | 11/2004 | Toshima et al. | 134/95.3 |
| 7,238,295 | B2 * | 7/2007 | Izuta et al. | 216/93 |
| 2003/0066549 | A1 * | 4/2003 | Noda et al. | 134/37 |
| 2006/0277690 | A1 * | 12/2006 | Pyo et al. | 8/149.2 |
| 2007/0175387 | A1 * | 8/2007 | Kimura | 118/429 |

FOREIGN PATENT DOCUMENTS

| | | | |
|---|---|---|---|
| GB | 2 052 701 | * | 1/1981 |
| JP | 56-5887 | | 1/1981 |
| JP | 63-296803 | * | 12/1988 |
| JP | 5-109686 | | 4/1993 |
| JP | 05-331652 | * | 12/1993 |
| JP | 7-234524 | | 9/1995 |
| JP | 09-219388 | * | 8/1997 |
| JP | 10-27771 | | 1/1998 |
| JP | 2000-100686 | | 4/2000 |
| JP | 2001-250773 | | 9/2001 |
| JP | 2002-110617 | * | 4/2002 |
| JP | 2002-184741 | | 6/2002 |
| JP | 2002-311602 | | 10/2002 |
| JP | 2002-353184 | | 12/2002 |
| JP | 2005-503019 | | 1/2005 |
| JP | 2005-191587 | | 7/2005 |
| KR | 1997-0023798 | | 5/1997 |
| KR | 2003-0062143 | | 7/2003 |
| WO | WO 2004/013455 | * | 2/2004 |
| WO | WO 2005/058753 A1 | | 6/2005 |

OTHER PUBLICATIONS

Office Action issued Apr. 7, 2011 in Japan Application No. 2006-012758 (With English Translation).

* cited by examiner

LIQUID TEMPERATURE 75° C

LIQUID TEMPERATURE 30° C

LIQUID TEMPERATURE 25° C

APPARATUS AND METHOD FOR PHOTORESIST REMOVAL PROCESSING

CROSS-REFERENCE TO RELATED APPLICATIONS

This application is based upon and claims the benefits of priority from the prior Japanese Patent Application No. 2006-012758, filed on Jan. 20, 2006; the entire contents of which are incorporated herein by reference.

BACKGROUND OF THE INVENTION

1. Field of the Invention

This invention relates to a processing apparatus and a processing method, and more particularly to a processing apparatus and a processing method suitable to removing photoresist used in lithography.

2. Background Art

In a lithography step of a process of manufacturing a semiconductor device or a liquid crystal panel, for example, an organic resist film is typically used as a patterning mask. The resist film needs removing after the patterning is completed. Methods for removing a resist film include a method of heating and dissolving the resist film with an organic solvent or the like. However, use of an organic solvent involves additional costs in facilities for waste liquid disposal. In particular, recent upsizing of semiconductor wafers and liquid crystal panels increases the amount of waste liquid generated in the process of resist peeling. This causes a problem of the associated increase in disposal costs and environmental loads.

JP 2001-250773A, for example, discloses a technology of spraying water vapor of 70 to 200° C. onto a substrate to peel and remove a resist film.

However, in particular, low molecular weight ingredients in the organic resist are left dissolved in water at high temperatures. Therefore, even if waste liquid is passed through a filter to recover and reuse water from the waste liquid, the resist is not trapped by the filter and is passed through the filter together with water. As a result, unfortunately, the water contaminated with resist is used again as vapor for resist peeling.

SUMMARY OF THE INVENTION

According to an aspect of the invention, there is provided a processing apparatus comprising: a tank configured to store water; vapor generating unit configured to turn the water supplied from the tank into vapor; a processing chamber in which vapor supplied from the vapor generating unit is used to remove residues from a workpiece; cooling unit configured to cool waste liquid ejected from the processing chamber; and filtering unit provided between the cooling unit and the tank, the filtering unit being configured to filter the waste liquid cooled in the cooling unit.

According to another aspect of the invention, there is provided a processing method comprising: supplying vapor into a processing chamber; removing residues from a workpiece using the vapor; cooling waste liquid containing the removed residues to precipitate the residues as solids; and filtering the waste liquid containing the precipitates.

BRIEF DESCRIPTION OF THE DRAWINGS

in FIG. 3 cooled down to a liquid temperature of 30° C. has been passed again.

in FIG. 4 further cooled down to a liquid temperature of 25° C. has been passed again.

DETAILED DESCRIPTION OF THE INVENTION

Figure 1:
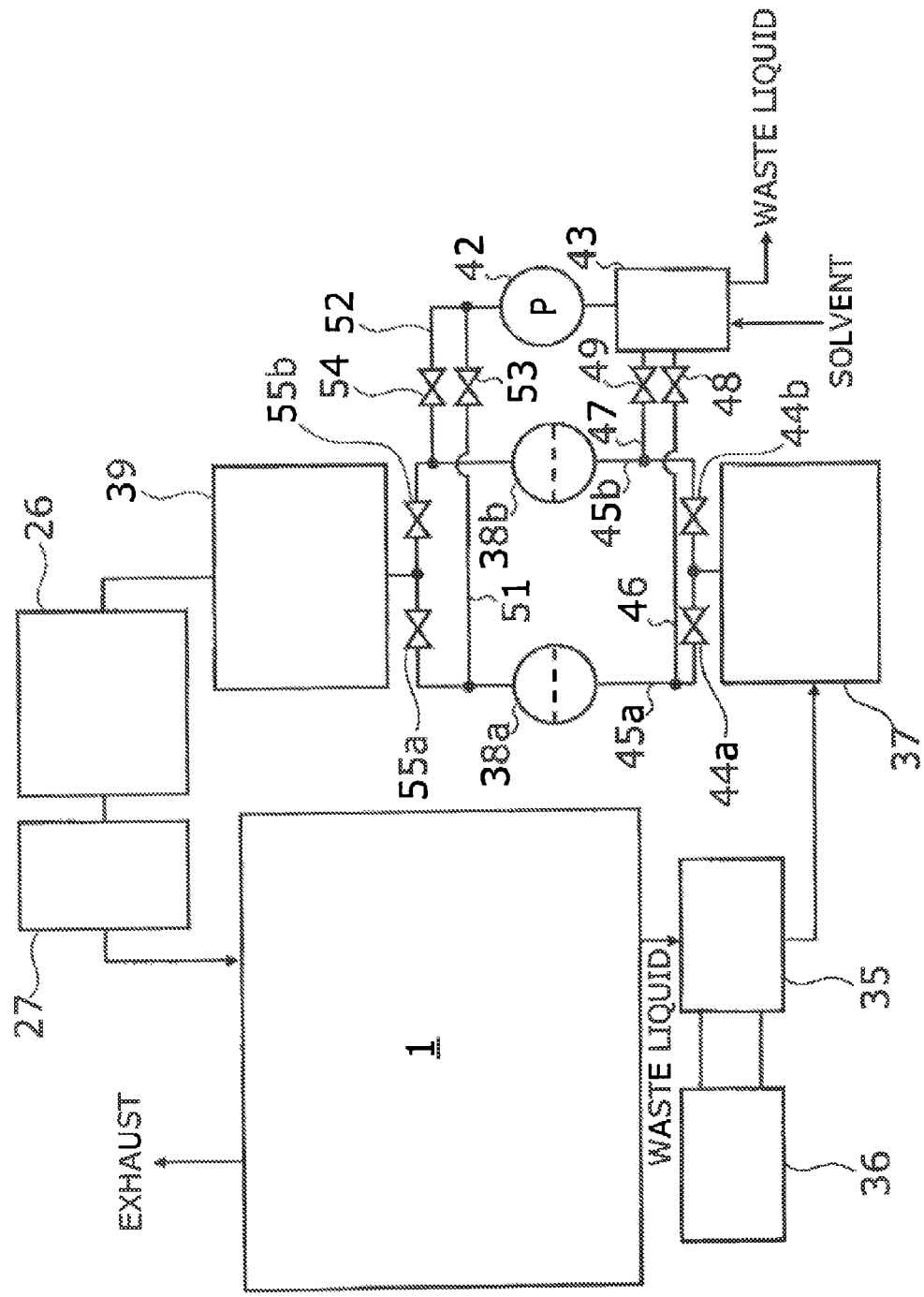
FIG. 1 is a schematic view illustrating the configuration of a processing apparatus according to an embodiment of the invention.

Embodiments of the invention will now be described with reference to the drawings, FIG. 1 is a schematic view illustrating the configuration of a processing apparatus according to an embodiment of the invention.

The processing apparatus according to this embodiment primarily comprises a tank 39 for storing water, a vapor generator 26 for turning water in the tank 39 into vapor, a vapor reheater 27 for heating vapor generated in the vapor generator 26, a processing chamber 1 in which the vapor supplied from the vapor reheater 27 is used to remove residues (matter to be removed) from a workpiece, a cooler 35 for cooling waste liquid ejected from the processing chamber 1, and filters 38a, 38b provided along a piping between the cooler 35 and the tank 39 for filtering the waste liquid cooled in the cooler 35.

The workpiece processed in the processing chamber 1 is, for example, a glass substrate for a liquid crystal panel. However, the workpiece is not limited thereto, but may be a substrate for a flat panel display, a semiconductor wafer, a lead frame, a printed wiring board, or the like.

Water such as ultrapure water or deionized water is stored in the tank 39. The vapor generator 26 generates vapor of ultrapure water or deionized water. The vapor reheater 27 heats the vapor generated in the vapor generator 26 to a prescribed temperature. The heated vapor is supplied into the processing chamber 1.

Figure 2:
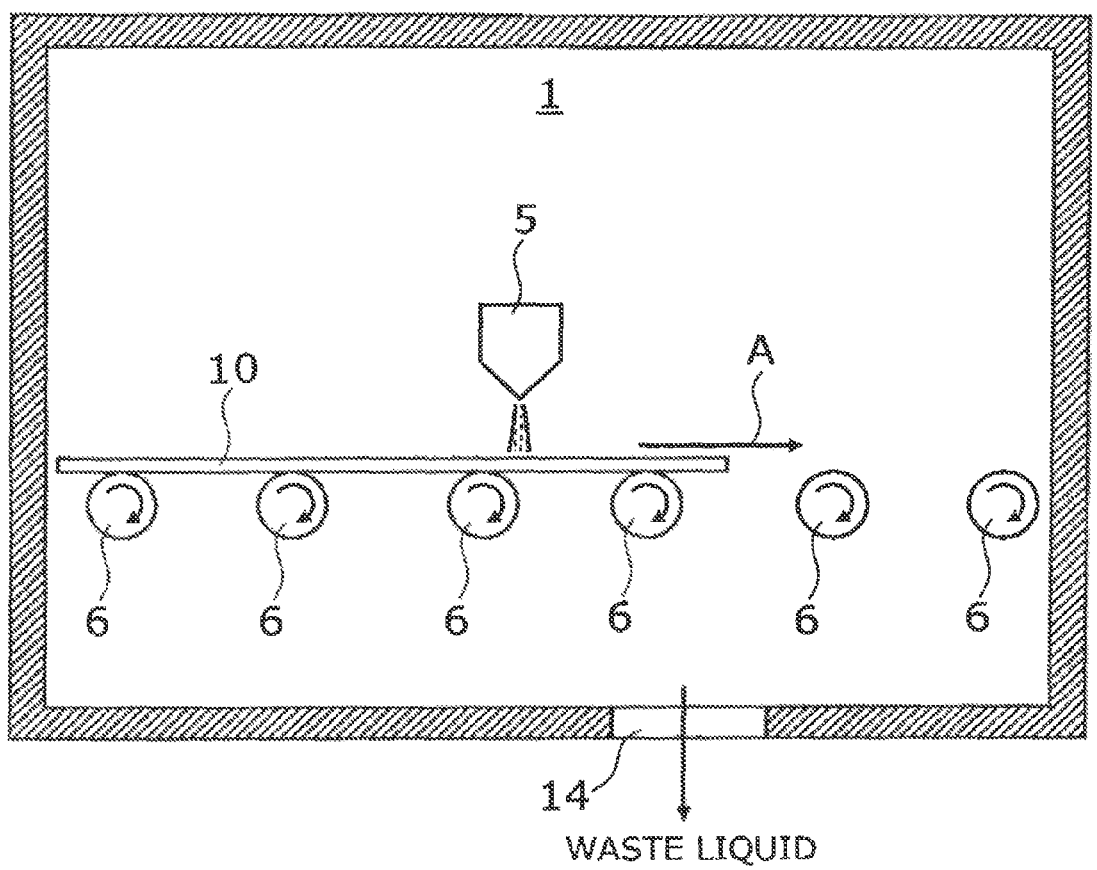
FIG. 2 is a schematic view illustrating the internal configuration of the processing chamber shown in FIG. 1.

FIG. 2 is a schematic view illustrating the internal configuration of the processing chamber 1.

In the processing chamber 1, a plurality of transfer rollers 6 are provided along the moving direction A of the workpiece 10. The transfer rollers 6 are rotatable while supporting the workpiece 10. The workpiece 10 is moved in the moving direction A on the transfer rollers 6. The workpiece 10 of up to 1.1 meters wide, for example, can be transferred by these transfer rollers 6. The transfer rate can be varied from 1 to 10 meters/min, for example.

Above the moving path of the workpiece 10 on the transfer rollers 6 is disposed a nozzle 5. The nozzle 5 has a discharge port opposed to the moving path of the workpiece 10. The vapor generated in the vapor generator 26 and heated in the vapor reheater 27 is discharged toward the workpiece 10 through the discharge port of the nozzle 5.

The flow rate of ultrapure water or deionized water introduced from the tank 39 into the vapor generator 26 for vapor generation is 4 to 10 liters/min, for example. The temperature of vapor discharged from the nozzle 5 can be controlled in the range of 100 to 140° C., for example.

Here, in light of temperature decrease due to adiabatic expansion that occurs when the water vapor is discharged into the atmosphere, the vapor generator 26 and the vapor reheater 27 are used to heat the water vapor to 180 to 300° C. so that the water vapor has a temperature of 100 to 140° C. on the surface of the processed substrate.

A water outlet 14 is formed at the bottom of the processing chamber 1. A wastewater piping, not shown, is connected to the water outlet 14. The wastewater piping is connected to the cooler 35 placed outside the processing chamber 1. The cooler 35 is supplied with cooling fluid such as cooling water from a chiller 36. The cooling fluid is circulated between the cooler 35 and the chiller 36. The cooler 35 cools the waste liquid ejected from the processing chamber 1 through the water outlet 14.

The cooler 35 is connected to a centrifuge 37. The centrifuge 37 uses centrifugal force to separate ingredients with different masses contained in the waste liquid cooled by the cooler 35.

The outlet piping of the centrifuge 37 is split into two pipings 45a, 45b, to which filters 38a, 38b are connected, respectively. The filters 38a, 38b are hollow fiber membrane filters, for example, and filter the waste liquid from which heavier solids have been removed in the centrifuge 37.

A valve 44a is provided between the inlet side of the filter 38a and the outlet side of the centrifuge 37. The outlet side of the filter 38a is connected to the tank 39 through a valve 55a.

Similarly, a valve 44b is provided between the inlet side of the filter 38b and the outlet side of the centrifuge 37. The outlet side of the filter 38b is connected to the tank 39 through a valve 55b.

That is, the two filters 38a, 38b are connected in parallel in the pipings between the centrifuge 37 and the tank 39.

The inlet side of the filter 38a is connected to a tank 43 through a piping 46 and a valve 48. Similarly, the inlet side of the filter 38b is connected to the tank 43 through a piping 47 and a valve 49. The tank 43 is different from the above-described tank 39 for storing water for use in processing a workpiece and stores a processing liquid for removing solids trapped by the filters 38a, 38b.

The outlet side of the filter 38a is connected to the discharge port of a hydraulic pump 42 through a piping 51 and a valve 53. Similarly, the outlet side of the filter 38b is connected to the discharge port of the hydraulic pump 42 through a piping 52 and a valve 54. The intake port of the hydraulic pump 42 is connected to the tank 43.

The hydraulic pump 42, the tank 43, the pipings 46, 47, 51, 52, and the valves 48, 49, 53, 54 constitute a filter cleaning mechanism for washing away and dissolving the solids trapped by the filters 38a, 38b.

Each valve is an electromagnetic valve, which is switched by a signal from a controller (not shown). The opening and closing of the valves can be controlled to switch each of the filters 38a, 38b to one of the following states. In one state, the filters 38a, 38b are in communication with the centrifuge 37 and the tank 39 and blocked from the filter cleaning mechanism including the hydraulic pump 42 and the tank 43. In the other state, the filters 38a, 38b are in communication with the filter cleaning mechanism and blocked from the centrifuge 37 and the tank 39.

Next, the processing of the workpiece using the processing apparatus according to the embodiment of the invention is described.

A workpiece 10 is transferred into the processing chamber 1 and moved along a moving direction A in the processing chamber 1 by the rotation of the transfer rollers 6 shown in FIG. 2. At this time, water vapor generated in the vapor generator 26 and heated in the vapor reheater 27 is discharged toward the workpiece 10 from the nozzle 5. The temperature and impact of this water vapor swells and peels the photoresist or other residues formed on the workpiece 10. The peeled resist is flushed with water from the workpiece 10 to the bottom of the processing chamber 1 and ejected outside the processing chamber 1 through the water outlet 14. This waste liquid is fed to the cooler 35.

Here, a chemical for facilitating dissolution of the photoresist can also be added to the water vapor discharged from the nozzle 5. In this case, water vapor, and water that has condensed from the water vapor after the processing, with photoresist ingredients being dissolved therein, remain on the processed portion of the workpiece. Such water vapor and water may be naturally cooled down and recoagulated on the substrate or other workpiece.

In this respect, in the processing apparatus (shown in FIG. 2) described above, another nozzle is placed at a prescribed position such as a position immediately downstream of the nozzle 5, and hot water sprayed from the other nozzle is supplied onto the substrate or other workpiece. Then water with photoresist ingredients being dissolved therein can be washed away from the substrate or other workpiece before the remaining photoresist ingredients dissolved in the water are recoagulated as described above.

The waste liquid fed from the cooler 35 is cooled by the cooling water supplied from the chiller 36. By this cooling, the resist removed from the workpiece 10 and contained in the waste liquid is precipitated as solids.

The waste liquid cooled in the cooler 35, which contains the resist precipitated as solids, is fed to the centrifuge 37, where the solids are separated into a heavier and lighter fraction. The heavier fraction is recovered here and not fed to the filters 38a, 38b in the subsequent stage. Alternatively, instead of the centrifuge, a separator based on gravity settling may be used to separate the waste liquid ingredients into a heavier and lighter fraction.

The waste liquid from which the heavier component has been removed in the centrifuge 37 is fed to the filter 38a, 38b. Both or either one of the filters 38a, 38b may be used. When both of the filters 38a, 38b are used, the valves 44a, 44b, 55a, 55b are opened. When only the filter 38a is used, the valves 44a, 55a are opened, and the valves 44b, 55b are closed. When only the filter 38b is used, the valves 44b, 55b are opened, and the valves 44a, 55a are closed. In any case, when the waste liquid is passed through the filters 38a, 38b, the valves 48, 49, 53, 54 are closed.

When the waste liquid is passed through the filter 38a, 38b, the lighter solids that were not recovered by the centrifuge 37 in the previous stage is trapped, and only the water that does not contain the resist removed from the workpiece 10 can be returned to the tank 39.

The water returned to the tank 39 is vaporized again and discharged from the nozzle 5, thereby being reused for removing resist from the workpiece 10. Solids are completely removed from the waste liquid before returning to the tank 39 as described above. Therefore the piping from the tank 39 to the vapor generator 26, the vapor reheater 27, and the nozzle 5 is free from contamination due to solids. Thus the efficiency of generating vapor and processing the workpiece 10 by vapor can be improved.

A hundred pieces of glass substrates with a photoresist of novolac resin being applied thereon, for example, were processed as a workpiece by using only the cooler 35 without using the centrifuge 37 and the filters 38a, 38b described above. Then 3.28 grams of residual photoresist solids were observed in the waste liquid returned to the tank 39.

When a similar processing was conducted using the centrifuge 37 in addition to the cooler 35, the amount of residual solids in the waste liquid returned to the tank 39 was 0.11 gram. Thus it was found that the centrifuge 37 can remove 96 percent or more by weight of residual solids.

Furthermore, when a similar processing was conducted using a filter (either one of the filters 38a and 38b) in addition to the cooler 35 and the centrifuge 37, the amount of solids in the waste liquid returned to the tank 39 was immeasurably small and scarcely observed.

Figure 3:
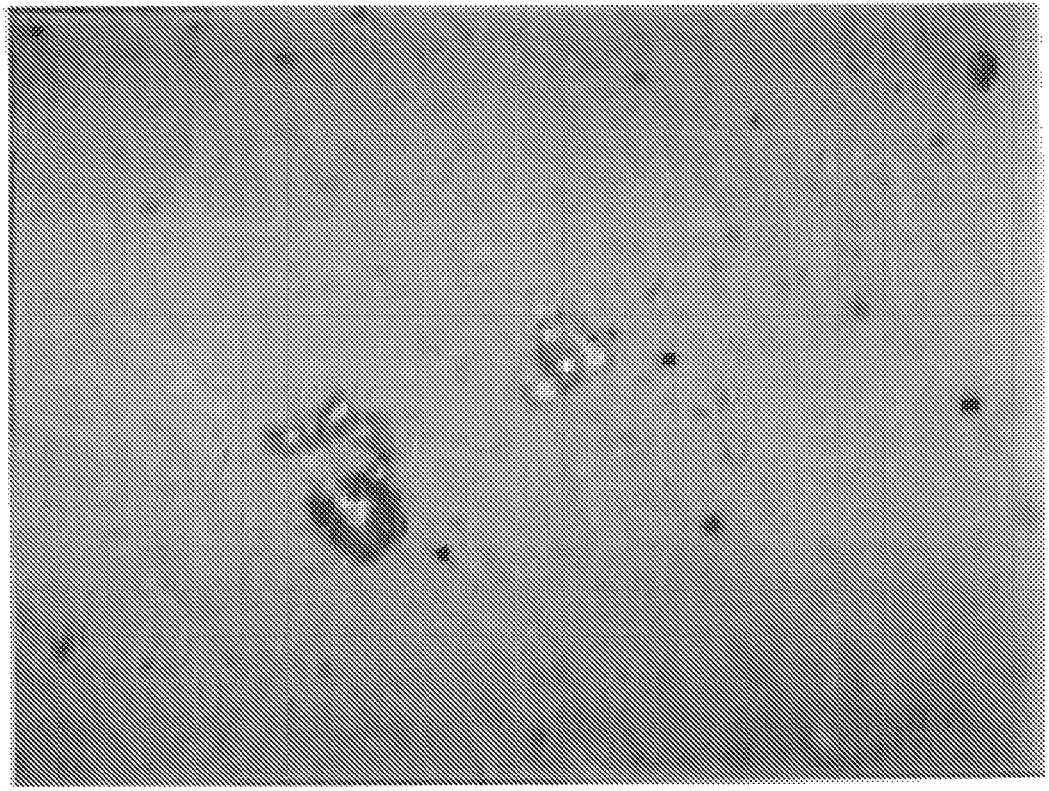
FIG. 3 is a photographic image of a filter through which waste liquid has been passed, where a workpiece is processed with a high-temperature vapor and the waste liquid is passed through the filter at a high temperature (75° C.) without being cooled.

FIG. 3 shows a photographic image of a filter through which waste liquid has been passed, where a glass substrate with a photoresist of novolac resin being applied thereon, for example, is processed with a high-temperature vapor and the waste liquid is passed through the filter at a high temperature (75° C.) without being cooled.

In this image, the presence of solids (resists) trapped by the filter is clearly observed.

Figure 4:
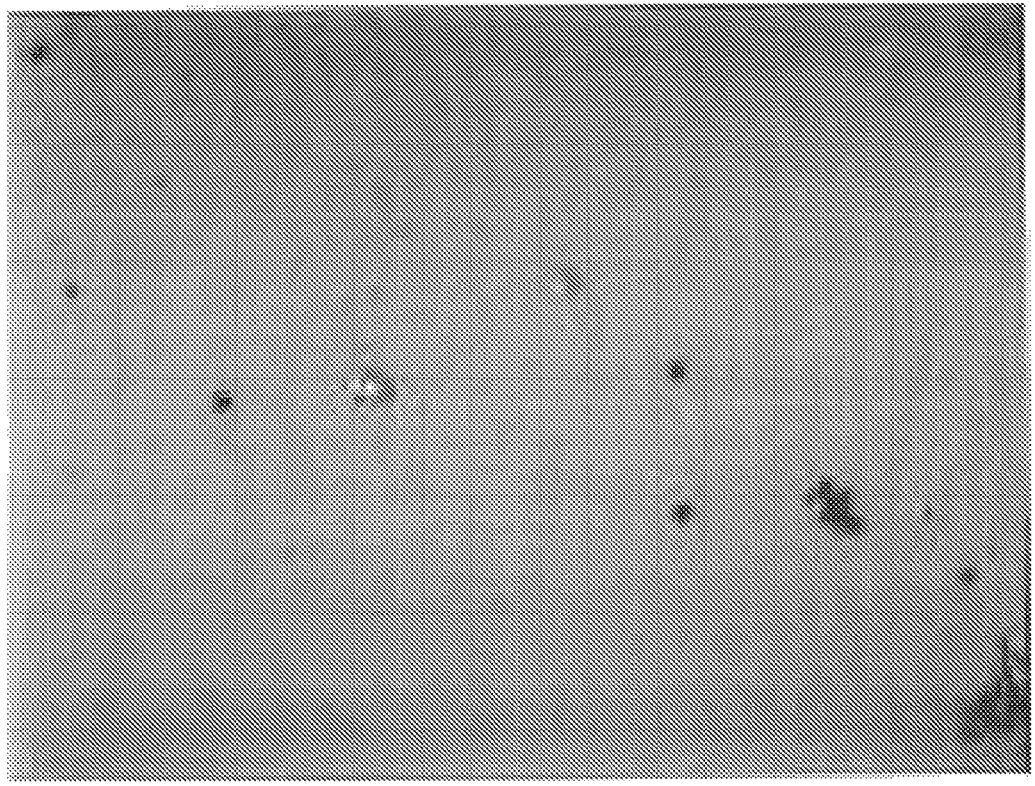
FIG. 4 is a photographic image of another similar filter through which the filtered waste liquid of 75° C.

FIG. 4 shows a photographic image of another similar filter (having the same mesh size) through which the filtered waste liquid of 75° C. in FIG. 3 cooled down to a liquid temperature of 30° C. has been passed again.

Here again, although smaller in amount than previously, solids (resists) were trapped by the filter. That is, the resist ingredients dissolved in the high-temperature (75° C.) waste liquid were precipitated as solids by being cooled down to 30° C.

Figure 5:
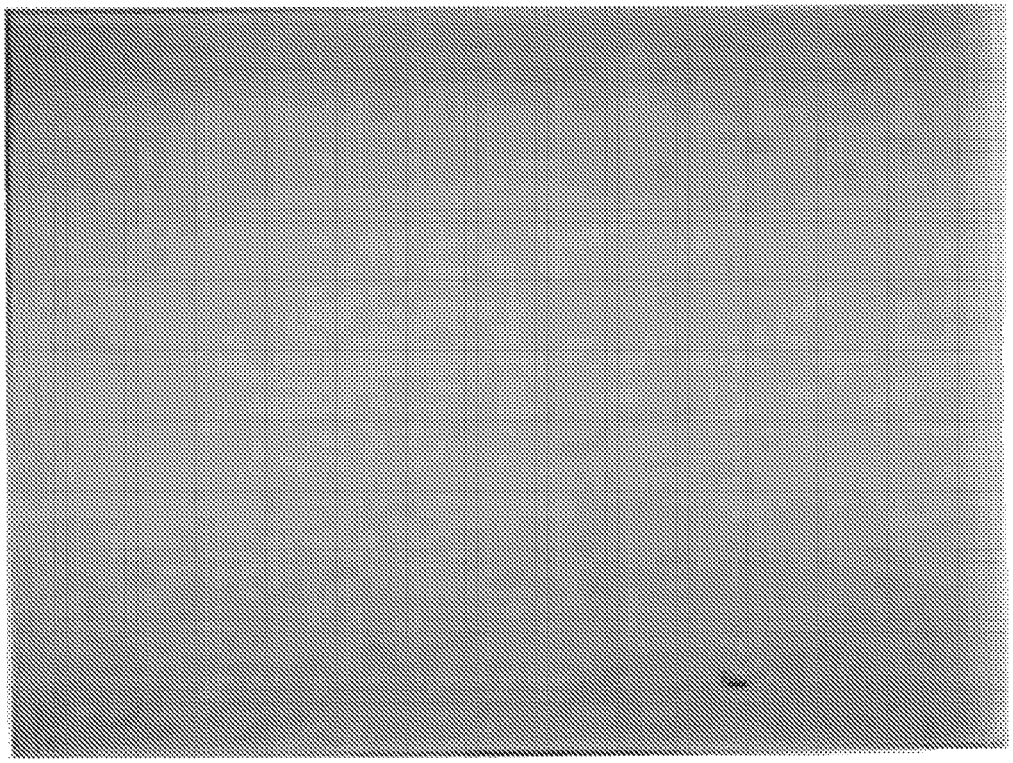
FIG. 5 is a photographic image of still another similar filter through which the filtered waste liquid of 30° C.

FIG. 5 shows a photographic image of still another similar filter (having the same mesh size) through which the filtered waste liquid of 30° C. in FIG. 4 further cooled down to a liquid temperature of 25° C. has been passed again.

In this case, no solids (resists) trapped by the filter were detected. Consequently, when the waste liquid produced by high-temperature vapor processing is cooled down, the resist ingredients can be reliably precipitated as solids, which can be reliably trapped by the filter in the subsequent stage, so that the water with resist ingredients being dissolved therein is not directly returned to the tank 39.

The solids trapped by the filters 38a, 38b can be removed by the filter cleaning mechanism.

For example, in the case of cleaning the filter 38a, the hydraulic pump 42 is operated with the valves 44a, 55a being closed and the valves 48, 53 being opened. The cleaning liquid (e.g. water) in the filter cleaning tank 43 is passed through the filter 38a in the opposite direction to the direction during the waste liquid processing described above, that is, in the direction from the outlet side to the inlet side of the filter 38a. Thus the solids trapped by the filter 38a can be removed from the filter 38a. The solids removed from the filter 38a are recovered into the tank 43.

At this time, the other filter 38b can be used for the normal processing of waste liquid by closing the valves 49, 54 and opening the valves 44b, 55b. Thus there is no need to stop the normal processing of waste liquid for filter cleaning.

In the case of cleaning the other filter 38b, the hydraulic pump 42 is operated with the valves 44b, 55b being closed and the valves 49, 54 being opened. The cleaning liquid in the filter cleaning tank 43 is passed through the filter 38b from the outlet side to the inlet side of the filter 38b. At this time, the filter 38a can be used for the normal processing of waste liquid by closing the valves 48, 53 and opening the valves 44a, 55a.

When about two thousand pieces of glass substrates with a photoresist of novolac resin being applied thereon, for example, were processed, there was an increased pressure loss due to the clogging of the filter with solids (resists). However, after the filter was backwashed with the cleaning liquid by the hydraulic pump 42, the pressure loss was returned to the level before the beginning of processing the two thousand pieces of glass substrates.

The cleaning liquid is not limited to water, but may contain any solvent that can dissolve photoresist and the like. In this case, the cleaning liquid does not necessarily need to be passed through the filter in the opposite direction.

Embodiments of the invention have been described with reference to the examples. However, the invention is not limited thereto, but various modifications can be made within the spirit of the invention.

Residues to be removed by vapor are not limited to photoresists. Furthermore, the workpiece, specific processing conditions and the like are also not limited to those described above.

Filters can be parallel connected in three or more stages. Alternatively, a single filter configuration can also be used. Furthermore, filters with different mesh sizes can be series connected in multiple stages. Series connection of filters in multiple stages further ensures that resists and other solids can be trapped.

The invention claimed is:

1. A processing apparatus comprising:
a tank configured to store water;
a vapor generating unit connected to the tank and configured to turn the water supplied from the tank into vapor;
a processing chamber, connected to the vapor generating unit, in which vapor supplied from the vapor generating unit is used to remove residues from a workpiece by temperature and impact of the vapor;
a cooling unit connected to the processing chamber and configured to cool waste liquid with the residues dissolved ejected from the processing chamber to precipitate the residues as solids;
a separating unit connected to the cooling unit, the separating unit being configured to separate the solids;
a filtering unit connected to the separating unit through a first valve provided between an inlet side of the filtering unit and an outlet side of the separating unit, and connected to the tank through a second valve provided between an outlet side of the filtering unit and an inlet side of the tank, the filtering unit being configured to trap the solids to pass water into the tank; and
a cleaning mechanism including a filter cleaning tank storing a processing liquid for removing the solids trapped by the filtering unit, the filter cleaning tank being connected to the filtering unit through a third valve provided between the inlet side of the filtering unit and the filter cleaning tank and through a fourth valve provided between an outlet side of the filtering unit and the filter cleaning tank.

2. The processing apparatus according to claim 1, wherein the separating unit separates the solids into heavier and lighter fraction and removes the heavier fraction.

3. The processing apparatus according to claim 2, wherein the separating unit is a centrifuge.

4. The processing apparatus according to claim 2, wherein the separating unit is a separator based on gravity settling to separate the waste liquid ingredients into a heavier and lighter fraction.

5. The processing apparatus according to claim 1, wherein the cleaning mechanism is configured to remove the solids trapped by the filtering unit by supplying the cleaning liquid from the outlet side of the filtering unit toward the inlet side thereof, while closing the first valve and the second valve and opening the third valve and the fourth valve.

6. The processing apparatus according to claim 5, wherein a plurality of the filtering units are connected in parallel between the cooling unit and the tank, each of the filtering unit being connected to the cleaning mechanism, and each of the filtering units is switchable between a state in which the filtering unit is in communication with the cooling unit and the tank and a state in which the filtering unit is in communication with the cleaning mechanism.

7. The processing apparatus according to claim 1, wherein the cleaning mechanism is configured to supply the filtering unit with the cleaning liquid which dissolves the solids trapped by the filtering unit, while closing the first valve and the second valve and opening the third valve and the fourth valve.

8. The processing apparatus according to claim 7, wherein a plurality of the filtering units are connected in parallel between the cooling unit and the tank, each of the filtering unit being connected to the cleaning mechanism, and each of the filtering units is switchable between a state in which the filtering unit is in communication with the cooling unit and the tank and a state in which the filtering unit is in communication with the cleaning mechanism.

9. The processing apparatus according to claim 1, wherein the processing chamber includes a nozzle which discharges the vapor toward the workpiece.

10. The processing apparatus according to claim 1, wherein the processing chamber includes a transfer mechanism which moves the workpiece.

11. The processing apparatus according to claim 1, wherein the filtering unit includes hollow fiber membrane filters.

\* \* \* \* \*